United States Patent
Santiago et al.

(10) Patent No.: US 6,208,001 B1
(45) Date of Patent: Mar. 27, 2001

(54) GALLIUM ARSENIDE SEMICONDUCTOR DEVICES FABRICATED WITH INSULATOR LAYER

(75) Inventors: Francisco Santiago, Fredericksburg, VA (US); Tak Kin Chu, Bethesda, MD (US); Michael F. Stumborg, Fredericksburg, VA (US); Kevin A. Boulais, Waldorf, MD (US)

(73) Assignee: The United States of America as represented by the Secretary of the Navy, Washington, DC (US)

( * ) Notice: Subject to any disclaimer, the term of this patent is extended or adjusted under 35 U.S.C. 154(b) by 0 days.

(21) Appl. No.: 09/197,440

(22) Filed: Nov. 23, 1998

Related U.S. Application Data

(60) Continuation-in-part of application No. 08/624,847, filed on Mar. 25, 1996, now Pat. No. 5,932,006, which is a division of application No. 08/246,206, filed on May 19, 1994, now abandoned.

(51) Int. Cl.[7] .............................. H01L 29/78; H01L 29/20
(52) U.S. Cl. ......................... 257/410; 257/289; 257/321; 257/411
(58) Field of Search ................................... 257/410, 289, 257/321, 324, 411

(56) References Cited

U.S. PATENT DOCUMENTS

| | | | |
|---|---|---|---|
| 4,291,327 | 9/1981 | Tsang | 357/52 |
| 4,550,331 | 10/1985 | Milano | 357/24 |
| 4,692,993 | 9/1987 | Clark et al. | 437/53 |

(List continued on next page.)

FOREIGN PATENT DOCUMENTS 2-266569  10/1990  (JP) .

OTHER PUBLICATIONS

S.M. Sze, "Semiconductor Devices Physics and Technology", 1985, pp. 208–210.

Truscott, et al., "MBE growth of $BaF_2/(Ga,In)(As,Sb)$ Structures", Journal of Crystal Growth, vol. 81 (1987), pp. 552–556.

Clemens, et al., "Growth of $BaF_2$ and of $BaF_2/SrF_2$ layers on (001) oriented GaAs", J. Appl. Phys., vol. 66, No. 4, Aug. 15, 1989, pp. 1680–1685.

Hung, et al., "Epitaxial growth of alkaline earth fluoride films on HF–treated Si and $(NH_4)_2$ $S_x$–treated GaAs without in situ cleaning", Appl. Phys. Lett., vol. 60, No. 2, Jan. 13, 1992, pp. 201–203.

Chaudhari, et al., "Calcium Fluoride thin films on GaAs (100) for possible metal–insulator–semiconductor applications", Appl. Phys. lett., vol. 62, No. 8, Feb. 22, 1993, pp. 852–854.

Colbow, et al., "Photoemission study of the formation of $SrF_2/GaAs(100)$ and $BaF_2/GaAs(100)$ interfaces", Physical Review B, vol. 49, No. 3, Jan. 15, 1994, pp. 1750–1756.

(List continued on next page.)

Primary Examiner—Jerome Jackson, Jr.
(74) Attorney, Agent, or Firm—James B. Bechtel, Esq.; Ramon R. Hoch, Esq.

(57) ABSTRACT

An insulator layer for single crystal gallium arsenide substrates in which the insulator layer is compliantly matched with the substrate and the insulator layer is free of defects causing surface roughness and crystalline defect problems which, otherwise, could impair device performance. To accomplish this, the insulator layer is formed on a gallium arsenide substrate as an integral composite or variegated structure including (a) a uniform homogenous film of Group IIa metal atoms attached directly onto a gallium arsenide substrate surface in the form of a monolayer, and (b) a single crystal epitaxial film of a Group IIa metal fluoride deposited on the monolayer.

16 Claims, 3 Drawing Sheets

U.S. PATENT DOCUMENTS

| | | | |
|---|---|---|---|
| 4,847,666 | 7/1989 | Heremans et al. | 357/16 |
| 5,124,762 | 6/1992 | Childs et al. | 357/16 |
| 5,352,917 * | 10/1994 | Ohmi | 257/410 |
| 5,435,264 | 7/1995 | Santiago et al. | 117/92 |

OTHER PUBLICATIONS

Chu, et al., "The Role of Barium in the Heteroepitaxial Growth of Insulator and Semiconductors on Silicon", Mat. Res. Symp. Proc., vol. 334, 1994, pp. 501–506.

Stumborg, et al., "Determination of growth mechanisms of MBE grown $BaF_2$ on Si(100) by target angle dependence of RBS yields", Nucl. Instr. and Methods in Physics Res. B, vol. 95, 1995, pp. 319–322.

Stumborg, et al., "Growth and interfacial chemistry of insulation (100) barium fluoride on gallium arsenide", J. Appl. Phys., vol. 77, No. 6, Mar. 15, 1995, pp. 2739–2744.

Stumborg, et al., "Surface chemical state populations in the molecular beam epitaxy deposition of $BaF_2$ on GaAs by x-ray photoelectron spectroscopy and heavy-ion backscattering spectroscopy", J. Vac. Sci. Technol., vol. 14, No. 1, Jan./Feb. 1996, pp. 69–79.

Chu, et al., "Heteroepitaxial deposition of Group IIa fluorides on gallium arsenide", Mat. Sci. and Eng. B, vol. B47, 1997, pp. 224–234.

* cited by examiner

FIG. 3
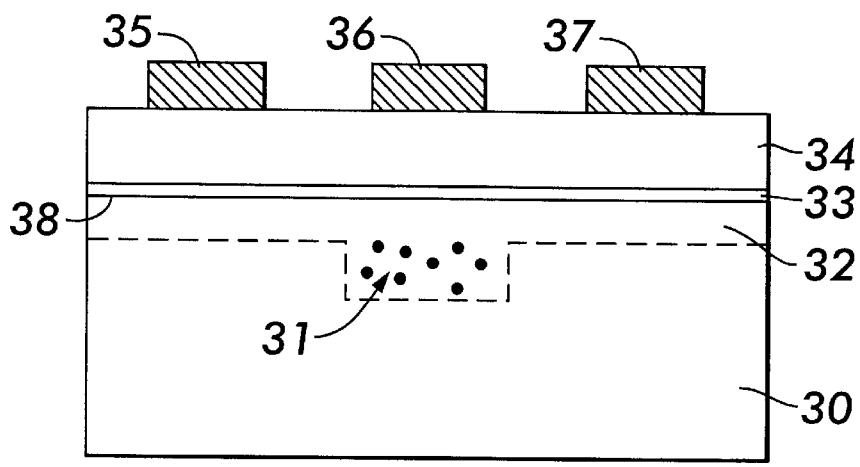
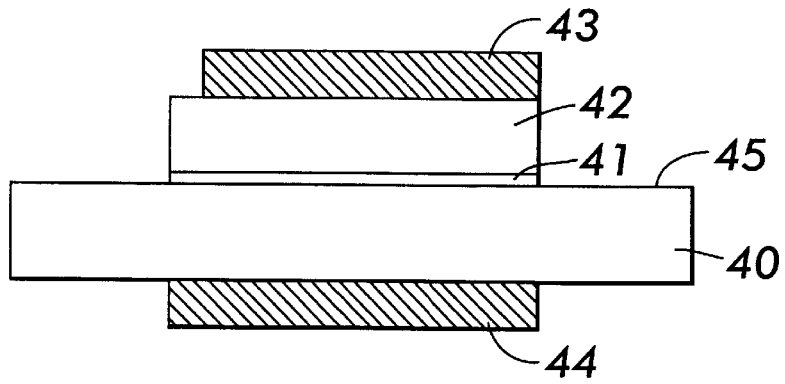
FIG. 4A
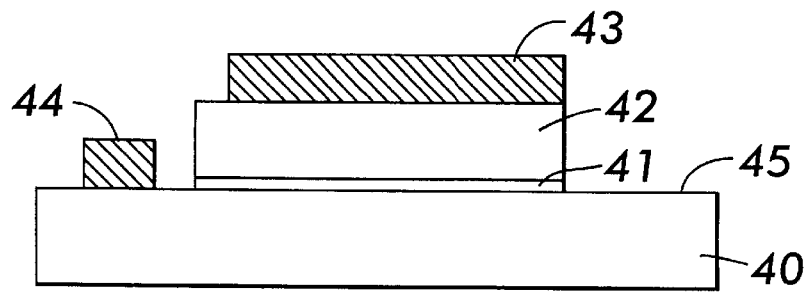
FIG. 4B

GALLIUM ARSENIDE SEMICONDUCTOR DEVICES FABRICATED WITH INSULATOR LAYER

CROSS-REFERENCE TO RELATED APPLICATIONS

This is a continuation-in-part of U.S. patent application Ser. No. 08/624,847, filed Mar. 25, 1996, now U.S. Pat. No. 5,932,006, which is a divisional of U.S. patent application Ser. No. 08/246,206, filed May 19, 1994, which is abandoned.

BACKGROUND OF THE INVENTION

This invention relates generally to insulator layers for gallium arsenide semiconductor devices and, more particularly, to insulator layers derived from Group IIa metal fluorides which are formed on single crystal gallium arsenide substrates.

Materials used in semiconductor devices must have good semiconducting properties, good electron mobility, and the ability to host an insulating material. Several materials are available which have good semiconducting properties and good electron mobilities but which are unsuitable because a good insulator cannot be formed on them. Silicon, however, is widely used in semiconductor devices because silicon dioxide forms naturally on silicon and silicon dioxide is a good insulator. The disadvantage of silicon is that its mobility is not as high as other semiconductors and silicon dioxide is not the strongest insulator available. This means that compromises in speed and performance are made when silicon is used in electronic devices.

Gallium arsenide (GaAs) is also a semiconductor and is used in some electronic applications. A device made out of GaAs would be faster than the same device made out of silicon because GaAs has an electron mobility that is considerably higher than that of silicon. Unfortunately, there is no native insulating oxide suitable for GaAs electronic devices. Also, many opto-electronic devices using GaAs substrates rely on epitaxial insulator/semiconductor heterostructures with abrupt interfaces which further increases the challenge of finding a suitable insulator for GaAs substrates for these applications.

Several materials have been used to provide insulating films on III–V compound semiconductor devices. Some of these films were previously used on silicon semiconductor devices. Examples of these film materials include $SiO_2$, $Si_3N_4$, $Al_2O_3$, and $P_2O_3$ films. New films have also been developed specifically for the III–V compound semiconductors. For instance, A. J. Shuskus (U.S. Pat. No. 4,546,372) developed an essentially oxygen-free, amorphous, phosphorous-nitrogen glass passivating film for III–V compound semiconductors. Similarly, J. Nishizawa et al. (U.S. Pat. No. 4,436,770) disclose new gallium oxynitride and aluminum oxynitride insulating films for III–V compound semiconductors. However, these materials have found only limited application.

Although the high dielectric strength of barium fluoride ($BaF_2$) (100) makes it a potentially interesting candidate as an insulating material, unfortunately $BaF_2$ and GaAs are severely lattice mismatched (~10% mismatched), which is a condition previously considered to be detrimental to epitaxial growth. The lattice mismatch problem has not been the only condition hindering the growth of epitaxial $BaF_2$ (100) on GaAs. It is known that the (100) face of the cubic fluorite structure of barium fluoride has a surface free energy far in excess of the (111) face. See, L. J. Schowalter et al., CRC Critical reviews in Solid State and Materials Sciences, pp. 367 (1989). For this reason, it has been thought that (111) growth is favored over (100) growth. Even when (100) growth is achieved, surface free energy considerations predict faceting of the (100) growth front into (111) asperites. This behavior has been observed for $CaF_2$, as described in the above-cited Schowalter et al. publication, and $BaF_2$, as described by M. F. Stumborg et al., *J. Appl. Phys.* 77(6), 2739 (1995).

Clemens el al., *J. Appl. Phys.* 66(4), 1680 (1989), reported being able to grow (100)-oriented $BaF_2$ on GaAs, but the orientation switched to (111) after only ~20 Å of film thickness. Furthermore, streaky RHEED patterns were not observed until the (111) orientations began to dominate. Films grown with a 400° C. substrate temperature exhibited signs of misoriented mosaic structures (i.e., rings in the RHEED patterns). Depositions at higher temperatures (580° C.) did not yield streaky RHEED patterns, leading Clemens el al. to state a conclusion that no two-dimensional growth of (100)-oriented barium fluoride seemed possible.

Truscott et al., *J of Crystal Growth*, 81, 552 (1987), also investigated the growth of $BaF_2$ on GaAs as well as the reverse heterostructure. They also found temperature dependent RHEED patterns indicative of (100) and (111) growth modes. However, they reported no achievement of two-dimensional $BaF_2$ (100) layers. In fact, they reported their $BaF_2$ films to be conducting, presumably due to Ga diffusion into the $BaF_2$ layer.

In view of the above, it would be desirable to provide an improved thin film insulator for gallium arsenide electronic devices which yields high quality device characteristics such as high-break down voltage.

SUMMARY OF THE INVENTION

In accordance with this invention, a unique insulator layer for single crystal gallium arsenide substrates is provided in which the insulator layer is compliantly matched with the substrate and the insulator layer is free of defects causing surface roughness problems which could impair device performance.

To accomplish this, the insulator layer is formed on a gallium arsenide substrate as an integral composite or variegated structure including (1) a uniform homogenous film of Group IIa metal atoms attached directly onto a gallium arsenide substrate surface in the form of a monolayer, and (2) a single crystal epitaxial film of a Group IIa metal fluoride deposited on the monolayer.

To fabricate the uniform, defect-free homogenous film portion of the insulator layer, the homogenous film is formed as the reaction product of a reaction between a Group IIa metal fluoride vapor and a gallium arsenide substrate surface in the presence of an arsenic gas overpressure. The arsenic gas overpressure effectively causes a monolayer of group IIa metal atoms to attach and form directly upon the gallium arsenide substrate surface without unreacted metal atoms (i.e., metal atoms not directly attached to the substrate surface) remaining in the homogenous film when the reaction is completed (i.e., the monolayer formation is completed) and a deposition of the epitaxial film of Group IIa metal fluoride onto the monolayer has commenced. The monolayer serves as a compliant interfacial layer that prevents lattice-mismatching problems from arising as between the gallium arsenide substrate and the epitaxial metal fluoride layer. Since the insulator layer can be fabricated in this manner in extremely thin submicron thicknesses while still being defect-free (i.e., without surface roughness problems and other crystalline defects such as dislocations and stacking faults), gallium arsenide electronic components which incorporate the insulator layer are endowed with superior break-down voltage characteristics, among other things.

The single crystal gallium arsenide substrate, upon which the insulator layer can be formed and utilized, may be a wafer or epitaxial layer of gallium arsenide, or a gallium arsenide based semiconductor alloy or a heterostructure of super-lattice made of a combination of gallium arsenic based alloys, or any of these forms of gallium arsenide as provided on another suitable substrate. Preferably, the single crystal gallium arsenide substrate surface and the single crystal epitaxial Group IIa metal fluoride film both are (100) oriented. In another preferred embodiment, the Group IIa metal fluoride used in fabricating the insulator film is barium fluoride.

A wide variety of gallium arsenide semiconductor devices can benefit from incorporating the insulator film of the present invention, including gallium arsenide metal insulator semiconductor field effect transistors (MISFETs), charge couple devices (CCDs), integrated circuit capacitors, nonvolatile memory, optical waveguides, and so forth. e

BRIEF DESCRIPTION OF THE DRAWINGS

These and other features, aspects, and advantages of the present invention will become better understood with regard to the following description, appended claims, and accompanying drawings where:

FIG. 3 is a schematic of a charge coupled device (CCD) containing the epitaxial structure of FIG. 1;

FIGS. 4A and 4B are schematics of capacitor devices containing the epitaxial structure of FIG. 1;

DETAILED DESCRIPTION OF THE PREFERRED EMBODIMENT

Figure 1:
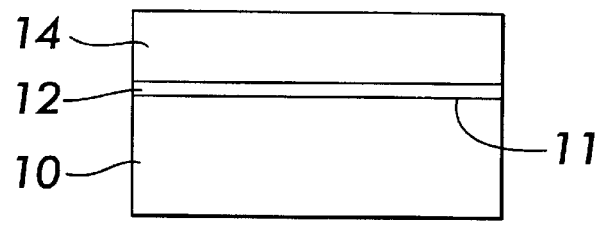
FIG. 1 is a schematic drawing of an insulator/gallium arsenide epitaxial structure of the invention.

The invention is directed to formation of improved insulators in gallium arsenide electronic devices such as metal insulator semiconductor field effect transistors (MISFETs), charge coupled devices (CCDs), and circuit capacitors.

Recent advances described in the present inventors' U.S. patent application Ser. No. 08/624,847, filed Mar. 25, 1996, now U.S. Pat. No. 5,932,006, the teachings of which are incorporated herein by reference for all purposes, address the lattice mismatch problem between GaAs and single crystal epitaxial barium fluoride by the creation of a compliant "template" layer on the GaAs (100) surface before $BaF_2$ deposition. Specifically, the surface is exposed to an extremely low flux of $BaF_2$ molecules, leaving a monolayer of Ba on the surface while driving off excess Ga and F as volatile GaF. Subsequently arriving $BaF_2$ molecules adhere to the surface as complete molecular units. The $BaF_2$ films deposited on the compliant Ba monolayer are epitaxial. This present invention is an advancement of this technology in that newly developed processing techniques make it is possible to form a $BaF_2$ surface that is exceptionally smooth and uniform as it is devoid of any significant atomic level roughness that might otherwise impair the performance of the device.

The insulator layer of this invention is formed by exposing a clean, hot single crystal gallium arsenide substrate to barium fluoride vapor in an ultrahigh vacuum environment with low background pressure with the presence arsenic gas during early stages of the process of forming the insulator. The barium fluoride is introduced in the ultrahigh vacuum environment maintained at a rate and temperature that permits the barium fluoride to react with the gallium arsenide while it is subjected to arsenic gas treatment, to initially form a homogenous reaction product layer, which is a monolayer of barium atoms less than 5 Å thick directly attached to the substrate surface. Once the monolayer formation is completed, i.e., a continuous single layer of barium atoms has formed over the exposed surface regions of the GaAs substrate without leaving bare spots in such exposed regions, the arsenic gas introduction is discontinued while the introduction of the barium fluoride is continued. The reaction product layer, i.e., the monolayer, provides a surface upon which a single crystal epitaxial layer of barium fluoride will then deposit in the same crystal orientation as the underlying single crystal gallium arsenide substrate. Since the monolayer forms relatively rapidly (e.g., generally within about 30 seconds or less), the arsenic gas overpressure preferably should be created at the GaAs substrate surface before the barium fluoride vapor flux is introduced.

Therefore, the temperature of the single crystal, gallium arsenide substrate and the barium fluoride vapor flux rate are adjusted, as well as the arsenic gas pressure, to allow the complete formation of the uniform monolayer before single crystal epitaxial barium fluoride can be deposited. The thickness of the monolayer is self-limiting. After a monolayer is formed, the arsenic gas is eliminated and the barium fluoride vapor flux continued at the same or a greater rate to deposit a single crystal epitaxial layer of barium fluoride on the monolayer (i.e., the reaction product layer). If the barium fluoride is deposited too rapidly before a uniform monolayer is completely formed, epitaxial growth of barium fluoride will occur in those places where the reaction product is first completed and a three dimensional island mode of barium fluoride growth will result, which is undesirable. Channels between the barium fluoride islands present paths of conduction that degrade the insulative properties of the barium fluoride. This problem is avoided when, according to this invention, care is taken to slowly deposit barium fluoride initially so that a uniform monolayer is properly formed in the presence of the arsenic gas before substantial barium fluoride epitaxial formation begins. When this care is taken, the barium fluoride will deposit as a uniform, two-dimensional single crystal, epitaxial layer which is an excellent insulator.

While not desiring to be bound to any particular theory at this time, it nonetheless is thought that the distinctions between the successful deposition of two-dimensional $BaF_2$ (100) in the present invention and previous efforts by others are at least two-fold: firstly, the presence of the arsenic overpressure before and during the initial stages of $BaF_2$ deposition replaces the volatile arsenic layer expelled from the GaAs (100) surface under these deposition conditions. Secondly, the low $BaF_2$ flux rate used permits the chemical interaction to run its course before the $BaF_2$ epitaxy begins. This low $BaF_2$ flux is only required long enough to form the compliant Ba monolayer. Once the compliant layer is formed, the BaF$_2$ flux can be increased without detrimental effects to the epitaxial quality of the BaF$_2$.

If no overpressure of arsenic gas back pressure is provided before and initially during deposition of the single crystal epitaxial layer of barium fluoride on the underlying homogenous layer, it is observed that a rough surface forms on the GaAs substrate which is replicated in the overlying insulator layer. This rough surface undermines the ability to achieve device quality insulation and high break down voltages. The rough surface, which is avoided and eliminated by the present invention, is thought to be attributable to barium atoms left present at the reaction product layer formed between the BaF$_2$ and the GaAs. The atomic barium is thought to occur at the barium fluoride/gallium arsenide reaction interface because gallium atoms in the GaAs substrate tend to form dimers with each other in the absence of the arsenic gas overpressure, which, in turn, react with fluoride species from the barium fluoride reactant to form gallium fluoride gas molecules that are exhausted from the reaction chamber, leaving barium atoms behind at the reaction interface which are not directly attached to the substrate surface, creating defects that roughen the surface of the completed insulator layer formed on the GaAs substrate. Therefore, the arsenic gas is introduced at a rate that is just enough to scavenge for any excess barium atoms that would otherwise remain behind to create defects on the GaAs surface.

The arsenic gas, i.e., As, As$_2$ and/or As$_4$, that is used to create the back pressure in the MBE chamber during initial barium fluoride vapor flux can be derived directly from a Knudsen or effusion cell of a MBE apparatus for supplying this element, or, alternatively, the arsenic gas can be derived from a precursor pumped into the MBE chamber, e.g. arsine (AsH$_3$), which is unstable and decomposes into tetraatomic arsenic molecules and hydrogen when heated.

The arsenic vapor/barium fluoride vapor rates ratio and time duration of the arsenic vapor treatment of the GaAs substrate are important parameters for the formation of the BaF$_2$ insulator layer of this invention. For BaF$_2$ growth, the arsenic/BaF$_2$ flux ratio generally can range from 20/1 to 1/4 (millibar arsenic/millibar BaF$_2$ units), and the duration of time for which this flux ratio is maintained ranges from between about 15 seconds to 60 seconds. Preferably, for BaF$_2$ deposition upon a GaAs substrate, the arsenic/BaF$_2$ flux ratio preferably should be approximately 10/1 (millibar arsenic/millibar BaF$_2$ units) and the duration of time for which this flux ratio is maintained ranges from between about 15 seconds to 60 seconds. This preferred 10/1 flux ratio applies as long as the arsenic flux is in the $10^{-6}$ millibar range and the BaF$_2$ flux is in the $10^{-7}$ millibar range. For example, suitable flux ratios meeting this condition would include, for example, $1.0 \times 10^{-6}$ millibar arsenic/$1.0 \times 10^{-7}$ millibar BaF$_2$, $3.0 \times 10^{-6}$ millibar arsenic/$3.0 \times 10^{-7}$ millibar BaF$_2$, $5.0 \times 10^{-6}$ millibar arsenic/$5.0 \times 10^{-7}$ millibar BaF$_2$, and so forth. In one preferred embodiment, an arsenic flux of $1.0 \times 10^{-6}$ millibar arsenic and a BaF$_2$ flux of $1.0 \times 10^{-7}$ millibar is created in the MBE chamber in the presence of the GaAs substrate for a concurrent period of time of 15 seconds. While the detailed descriptions herein exemplify the use of barium fluoride as the compound used to form the insulator layer for sake of illustration, it will be appreciated that other Group IIa metal fluorides, such as calcium fluoride and strontium fluoride, also can be used in a similar manner in the practice of this invention instead of barium fluoride. The Group IIa metal atoms of barium, strontium, and calcium have a size (i.e., the diameter of the largest electron orbital) of less than 5 Å, i.e., the atomic diameter of barium is 4.48 Å, and that of strontium is 4.29 Å, and that of calcium is 3.94 Å. It therefore can be appreciated how the formation of a monolayer of these metal atoms, for example, on a GaAs substrate by the techniques presented herein, permits the formation of an extremely thin, yet effective compliant layer upon which a single crystal epitaxial metal fluoride can be provided. The thickness of a uniform monolayer of Ba, Sr, or Ca atoms, as formed by the present invention, will be greater than zero and less than 5 Å.

In one preferred mode of this invention, a single crystal GaAs epitaxial layer ("epilayer") substrate is formed on a standard commercial grade single crystal gallium arsenide crystal wafer or other suitable substrate for a GaAs epilayer, in a commercial molecular beam epitaxial (MBE) deposition chamber, such as model Semicon V8OH made by Vacuum Generators, having a standard substrate heater. Both gallium and arsenic fluxes are concurrently provided to grow the epitaxial GaAs. The GaAs wafer preferably is chemically wet-etched before being introduced to the growth chamber to improve its surface morphology. Single crystal GaAs epilayer deposition is stopped when a streaky RHEED pattern is observed. The deposition of GaAs is stopped by closing the Ga source; however, the arsenic source is left open to maintain the improved morphology. The MBE chamber is evacuated to a background pressure of preferably less than $10^{-9}$ millibars, more preferably less than $10^{-10}$ millibars, and still more preferably less than $10^{-11}$ millibars and is trapped with liquid nitrogen. Then a BaF$_2$ shutter is opened. After a brief period of time (e.g., about 15 to 60 seconds) sufficient to permit a uniform two-dimensional monolayer of barium atoms to form on the surface of the GaAs epilayer, the arsenic gas shutter is closed while the BaF$_2$ shutter remains open to vapor deposit barium fluoride on the monolayer. As will be appreciated from a practical standpoint, the mechanics necessary for opening/closing the various source gas shutters to the MBE chamber, according to the protocol described above, cannot be executed instantaneously and that certain very brief time periods will be associated with completely opening or closing the respective effusion cell shutters, as necessary, such that flux concentrations will briefly transition in the chamber. However, these inadvertent brief transition periods for the fluxes have not been found to adversely effect the results.

The barium fluoride flux rate preferably is such as to provide a monolayer formation within about 60 seconds or less, and more preferably, in less than 30 seconds, at an approximately 700° C. substrate temperature. The rate of the barium fluoride vapor must be slow enough to permit the complete formation of the monolayer reaction product layer before barium fluoride molecules begin to deposit (grow epitaxially) on the monolayer reaction product. The temperature range given above is the substrate heater temperature. The actual substrate is at a somewhat lower temperature. This is true for other commercial substrate heaters and is understood, by those of ordinary skill in this art. Moreover, heater temperatures over the range of from 500° C. to 700° C. produce the same uniform, monolayer. Substrate heater temperature ranges are preferably from 500° C. to 700° C., more preferably from 550° C. to 700° C. and still more preferably from 575° C. to 700° C. At heater temperatures near the lower end of the range, the deposition rate is decreased to permit the complete formation of the reaction layer before a substantial amount of barium fluoride is deposited.

The same monolayer reaction product is consistently produced even at different substrate heater temperatures over the range of 500° C. to 700° C. Moreover, the reaction product can be characterized by a number of physical properties. First, the RHEED pattern of the monolayer reaction product is similar to that of $BaF_2$ (same symmetry, different spot shapes). Next, XPS results indicate lower Ba 3d bonding energies than those of $BaF_2$. Most important, uniform single crystal, epitaxial barium fluoride is deposited on single crystal gallium arsenide substrates that are coated with a uniform monolayer under conditions that would have produced amorphous or polycrystalline barium fluoride on a bare, clean single crystal gallium arsenide substrate without the monolayer reaction product layer. It is the deposition of the uniform single crystal, epitaxial barium fluoride layer that confirms that the desired uniform two-dimensional monolayer is present.

The same results, in terms of forming the uniform monolayer on a GaAs substrate, can be achieved using a preformed substrate having a GaAs epilayer film already grown on a substrate from a separate previous processing operation or as obtained as such from a supplier, by heating the preformed GaAs epilayer film and substrate in arsenic vapor until the film reaches the appropriate temperature for $BaF_2$ deposition. Then, the $BaF_2$ deposition is performed.

Once the uniform monolayer has been formed on a single crystal gallium arsenide substrate of either of the above-discussed origins, the deposition of a uniform, single crystal, epitaxial barium fluoride insulator layer becomes straightforward. The rate of deposition of barium fluoride is no longer as critical. The uniform, single crystal epitaxial barium fluoride can be formed by depositing barium fluoride vapor on uniform, epitaxial barium fluoride/gallium arsenide reaction product coated substrates at temperatures of 400° C. to room temperature at deposition rates of about 50–300 Å per minute. The crystal orientation of the uniform, single crystal epitaxial barium fluoride layer is the same as that of the single crystal gallium arsenide substrate. For example, uniform (100) oriented single crystal epitaxial barium fluoride layers are deposited on (100) oriented single crystal gallium arsenide substrates and uniform (111) oriented single crystal epitaxial barium fluoride layers are deposited on (111) single crystal gallium arsenide substrates. This means that the intervening monolayer reaction product layer is uniform and of the same crystal orientation as the single crystal gallium arsenide substrate. If the single crystal gallium arsenide substrate surface has a (100) crystal orientation, the single crystal epitaxial barium fluoride layer will have a two dimensional (100) oriented structure as shown by RHEED pattern. On the other hand, if the single crystal gallium arsenide substrate surface has a (111) crystal orientation, the single crystal epitaxial barium fluoride layer will have a two dimensional (111) oriented structure as shown by RHEED pattern.

After the uniform monolayer is formed, the vacuum is maintained at a background pressure of preferably less than $10^{-8}$ millibars, more preferably less than $10^{-9}$ millibars, and still more preferably less than $10^{-10}$ millibars. The barium fluoride is deposited at a rate of preferably 1 to 5 Å per second, and more preferably 2 to 3 Å per second.

Single crystal epitaxial layers of barium fluoride grown at temperatures above 500° C. contain small amounts of gallium on the order of 1 to 50 ppm. It is has been found that these traces of gallium do not adversely affect the insulative properties of the barium fluoride layer. Gallium containing barium fluoride (1052 Å thick) produced at 600° C. has a capacitance of 550.0 pF, an average breakdown voltage above $8\times10^6$ V/cm, and a dielectric constant of ~7.5 which is close to that of bulk barium fluoride. Depositing barium fluoride on the uniform monolayer at temperatures of 400° C. or lower produces a single crystal epitaxial barium fluoride layer that is free of gallium. However, the insulating properties of the gallium-containing and the gallium-free barium fluoride layers are the same. Therefore the term barium fluoride layer as used in describing the improved devices (capacitors, MISFETs, CCDs, etc.) of this invention includes both gallium-containing and gallium free barium fluoride.

The term single crystal gallium arsenide substrate, as used herein, preferably includes doped or undoped gallium arsenide single crystal wafers, doped or undoped gallium arsenide epitaxial layers on gallium arsenide single crystal wafers, doped or undoped epitaxial layers of gallium arsenide alloys (for example, gallium aluminum arsenide, gallium indium arsenide, and so forth) on single crystal gallium arsenide wafers, heterostructures of super-lattice made of combinations of gallium arsenide alloys on gallium arsenide single crystal wafers, doped or undoped gallium arsenide single crystal epitaxial layers on suitable substrate materials, doped or undoped epitaxial layers of gallium arsenide alloys on suitable substrate materials, and heterostructures of super-lattice made of combinations of gallium arsenide alloys on suitable substrate materials. More preferably the single crystal gallium arsenide substrate includes doped or undoped gallium arsenide single crystal wafers, doped or undoped gallium arsenide epitaxial layers on gallium arsenide single crystal wafers, and doped or undoped gallium arsenide single crystal epitaxial layers on suitable substrate materials. The gallium arsenide alloys include those that are conventionally used in semiconductor devices. Gallium arsenide alloys that are rich in gallium are preferred. The suitable substrate materials include materials that provide physical support for a thin epitaxial layer of gallium arsenide or gallium arsenide alloys without chemically or electrically interfering with the operation of the epitaxial layer. For example, a thin single crystal epitaxial layer of gallium arsenide on a hybrid semiconductor device or on a chemically inert, electrically insulating circuit board structure. Thus, the single crystal gallium arsenide substrate need not be a wafer but rather can be a thin epitaxial layer requiring support by a non-gallium arsenide material. The single crystal gallium arsenide substrate bulk stoichiometry may be balanced, gallium rich, or arsenic rich.

However, because the single crystal gallium arsenide substrate is heated at from 500° C. to 700° C. for substantial periods of time during the $BaF_2$ deposition, some doping operations may have to be done after the barium fluoride deposition to alter the doping profile of the doped areas. The single crystal gallium arsenide substrate may have any of the conventional orientations including (100), (110), (111), and their equivalents. Commercial standard electronic grade polished and etched (100) and (111) oriented crystal wafers are generally suitable for use as a starting material for the practice of this invention.

The commercial standard grade single crystal gallium arsenide substrate wafers come with a polycrystalline oxide passivation layer that must be removed. The presence of the polycrystalline passivation layer can be detected by analytical techniques like x-ray photoelectron spectroscopy (XPS) and reflective high energy electron diffraction (RHEED). The passivation layer will show oxygen in the XPS spectrum and a RHEED diffraction pattern that shows scattered dots and concentric circles. Removal of the passivation layer leaves the bare gallium arsenide surface whose smoothness is confirmed by the RHEED pattern that shows ordered spots connected with streaks and the absence of oxygen in the XPS spectrum. Conventional methods for removing the passivation layer may be used. A preferred method is by annealing the gallium arsenide in a vacuum. The single crystal gallium arsenide wafers can be annealed in conventional annealing equipment, such as a VG Semicon V80H deposition chamber for one hour at approximately 600° C. in a vacuum of better than $1\times10^{-9}$ millibar. Prior to insulator film formation, the substrate surface morphology also can be improved using wet chemical etching and GaAs homoepitaxial deposition.

Referring now to the figures, FIG. 1 is a schematic drawing or a cross section of a basic structure comprising a single crystal gallium arsenide semiconductor substrate 10; a homogenous layer 12, which is comprised of the monolayer reaction product of the barium fluoride and gallium arsenide, covering a portion of the surface 11 of the single crystal gallium arsenide substrate 10; and a uniform, single crystal epitaxial barium fluoride insulator layer 14 which is deposited on the monolayer 12. The uniform monolayer 12 is less than about 5 Å thick. For electronic devices the uniform, single crystal epitaxial barium fluoride insulator layer 14 normally will be from about 50 to 1000 Å thick, but layers up to 10,000 Å are easy to produce if appropriate. In practice, the electrical properties of the extremely thin monolayer 12 may be ignored and the structure may simply be considered to be a single crystal epilayer of barium fluoride 14 deposited on the single crystal GaAs substrate. This basic structure can be used to make integrated circuit capacitors, metal insulator semiconductor field effect transistors (MISFETS), charge couple devices (CCDs), and other types of gallium arsenide electronic devices requiring a metal insulator semiconductor junction.

A structure of the type shown in FIG. 1 can be used as the dielectric portion of a gallium arsenide semiconductor integrated circuit capacitor. Epitaxial barium fluoride is formed on the gallium arsenide to provide the dielectric insulator element of the capacitor and two metal electrodes are deposited on adjacent sites of the epitaxial barium fluoride to form a metal insulator metal (MIM) integrated circuit capacitor. Similarly, by depositing one metal on top of the single crystal epitaxial barium fluoride layer and another electrode on the gallium arsenide semiconductor a metal insulator semiconductor (MIS) capacitor can be produced. A similar procedure can be used to produce a semiconductor insulator semiconductor (SIS) capacitor.

The basic barium fluoride epitaxial insulator layer 14 and single crystal gallium arsenide semiconductor substrate 10 structure shown in FIG. 1 can also be used as the basis of an improved gallium arsenide metal insulator semiconductor field effect transistor (MISFET). The element may be used to make depletion mode MISFETs as well as enhancement mode MISFET's. This will include n-channel depletion mode MISFET's, p-channel depletion mode MISFET's, n-channel enhancement mode MISFET's, and p-channel enhancement mode MISFET's.

Figure 2A:
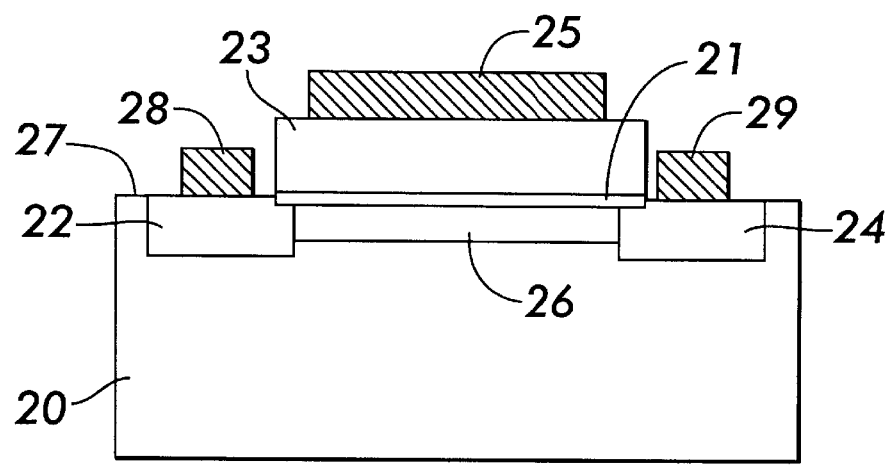
FIG. 2A is a schematic drawing of a depletion mode metal insulator semiconductor field effect transistor (MISFET) containing the epitaxial structure of FIG. 1.
Figure 2B:
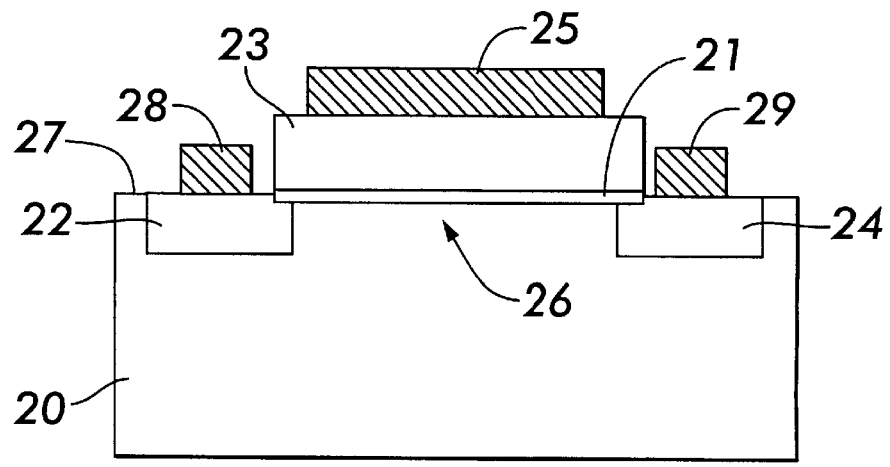
FIG. 2B is a schematic drawing of an enhancement mode MISFET containing the epitaxial structure of FIG. 1.

FIG. 2A is a schematic drawing representing a depletion mode MISFET according to this invention. Shown are a single crystal gallium arsenide semiconductor substrate 20 which has been doped to produce a source region 22, a drain region 24, and a channel region 26. The channel region 26 connects the source region 22 to the drain region 24. An ohmic source electrode 28 is deposited onto the source region 22 and an ohmic drain electrode 29 is deposited onto the drain region 24. An insulator epitaxial barium fluoride layer 23 is deposited on the surface 27 of the single crystal gallium arsenide semiconductor substrate 20 over the channel region 26 via an intervening monolayer 21 according techniques described herein. A gate electrode 25 is deposited onto the barium fluoride epitaxial layer 23 so that the barium fluoride layer 23 insulates the gate electrode 25 from the channel region 26. As will be understood, the above-mentioned ohmic source and drain electrodes, and the gate electrode, are formed of a highly conductive material such as metal or a highly doped semiconductor. The thin monolayer reaction product zone 21 is shown between the barium fluoride epitaxial layer 23 and the channel region 26 of the single crystal gallium arsenide semiconductor substrate 20. The monolayer 21, which is the reaction product of the gallium arsenide surface and barium fluoride, will not significantly affect the operation of the MISFET device. FIG. 2B is a schematic drawing representing an enhancement mode MISFET according to this invention. The labeled parts are the same as in FIG. 2A except that the channel, region 26 is normally off until application of an appropriate voltage on the gate 25.

The relatively high temperature (500° C. or above) of the present process, may require that certain doping steps be performed after the barium fluoride epitaxial layer has been grown. However, the single crystal gallium substrate under the barium fluoride layer may be doped by using conventional ion beam implantation techniques. The dopant ions will pass through the barium fluoride layer and be implanted in the single crystal gallium arsenide substrate. The single crystal gallium arsenide substrate will then be annealed to diffuse the dopant ions in the single crystal gallium arsenide substrate. For example, a MISFET device may be produced by combining the present process within beam implantation as follows. First, a barium fluoride epitaxial crystal insulator layer is grown on a single crystal gallium arsenide substrate according to the process of this invention. Holes are left in the barium fluoride film for source and drain regions. The source and drain regions are then doped according to conventional techniques. Metal electrodes are then deposited onto the source and drain regions. Next an ion beam is used to implant dopant ions through the barium fluoride film into the single crystal gallium arsenide substrate. The metal electrodes protect the source and drain regions from the ion beam. The single crystal gallium arsenide substrate is annealed to diffuse the ion implanted dopant to complete the doping of the channel region.

The process and products of the present invention are designed to be used to produce large scale integrated circuits. For example, this includes large scale computer logic and control circuit arrays containing many depletion mode MISFETS, enhancement mode MISFETs, MIM capacitors, and so forth. It also includes large scale memory arrays containing many charge couple devices and associated circuitry.

FIG. 3 is a schematic drawing representing a charge coupled device (CCD) according to this invention. Shown is a p-type single crystal gallium arsenide wafer 30 with or without an epitaxial layer of single crystal gallium arsenide. An insulator barium fluoride epitaxial layer 34 is deposited onto the surface 38 of the gallium arsenide wafer 30 via an intervening monolayer 33 according techniques described herein. The thin monolayer 33, which is the reaction product of the gallium arsenide and barium fluoride, is shown located between the barium fluoride epitaxial layer 34 and the gallium arsenide wafer 30. The reaction product layer 33 (i.e., monolayer 33) will not significantly affect the operation of the charge coupled device. Metal gate electrodes 35, 36, and 37 are deposited onto the barium fluoride epitaxial layer 34 so that the barium fluoride epitaxial layer 34 insulates the metal gate electrodes 35, 36, and 37 from the p-type single crystal gallium arsenide wafer 30. The metal gate electrodes 35, 36, and 37 serve as gates for the charge transfer signals. When gate 36 has a higher (more positive) voltage than gates 35 and 37, the charges 31 are concentrated in region 32 just below gate 36 which serves as a charge storage. When either gate 35 or 37 is pulsed to a higher (more positive) voltage than gate 36 the charge 31 will be transferred to the pulsed gate. The device shown in FIG. 3 is just an illustrative example of how to use the present invention in charge couple devices, different schemes and layouts can be used for the charge couple devices.

FIGS. 4A and 4B are schematics of several configurations of capacitor devices according to this invention. Shown is a doped single crystal gallium arsenide wafer 40 with or without an epitaxial layer of single crystal gallium arsenide. An insulator barium fluoride epitaxial layer 42 is deposited onto the surface 45 of the gallium arsenide wafer 40 via intervening thin monolayer 41 according to the techniques described herein. The thin monolayer 41 is the reaction product of the gallium arsenide and barium fluoride and it is located between the barium fluoride epitaxial layer 42 and the gallium arsenide wafer 40. Metal electrode 43 is deposited on the barium fluoride epitaxial layer 42 and metal electrode 44 is deposited on the same or opposite side of the single crystal gallium arsenide wafer 40.

Figure 6:
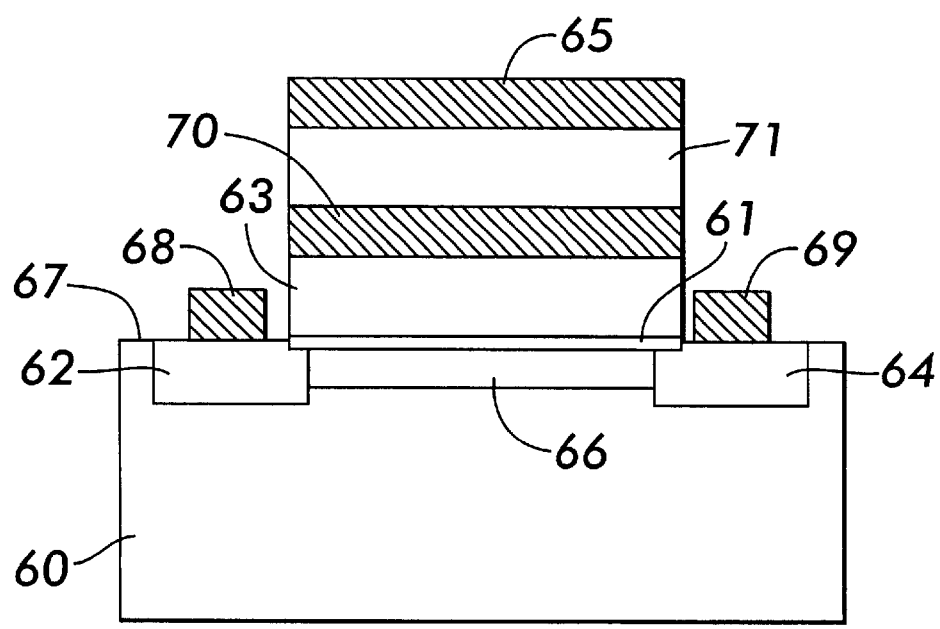
FIG. 6 is a schematic of a nonvolatile memory device containing the epitaxial structure of FIG. 1.

FIG. 6 is a schematic drawing representing a nonvolatile memory according to this invention. This present invention is also applicable to nonvolatile memory devices, such as a floating-gate nonvolatile memory as shown in FIG. 6. This device is somewhat similar to MISFETs exemplified in FIGS. 2A and 2B above except for the added components including a highly conductive floating gate 70, a secondary insulator 71, and a highly conductive gate electrode 65. FIG. 6 includes single crystal GaAs semiconductor substrate 60 and its surface 67, monolayer 61, ohmic source region 62, insulator epitaxial barium fluoride 63, ohmic drain region 64, channel region 66, and highly conductive materials 68 and 69 (e.g., metals). The floating gate 70 can hold charge for an extended period of time even up to 100 years. When the floating gate 70 is uncharged, and the gate electrode 65 has no voltage, the channel of charge 66 will exist and conduct between the drain region 64 and the source region 62. This represents two binary states for binary memory applications. The floating gate 70 can be charged and discharged by electrons from the channel 66 of enough energy to overcome the energy barrier presented by the insulator epitaxial barium fluoride 63, or by making the insulator 63 exceptionally thin (e.g., less than 10 nanometers), by electrons from the channel 66 by tunneling through the energy barrier presented by the insulator epitaxial barium fluoride 63. The direction of electron flow (to or from the floating gate 70) can be controlled by the voltage on gate electrode 65. The electrons can obtain the necessary energy by either applying sufficient voltage to the source region 62 or the drain region 64, or by illumination with energetic photons such as ultraviolet light. Such devices rely on unprecedented control of the insulator epitaxial barium fluoride 63 including its thickness, purity, and uniformity which have been demonstrated in this invention.

In another embodiment of this invention, a useful intermediate product is produced by forming the uniform, thin monolayer reaction product of barium fluoride and gallium arsenide on a single crystal gallium arsenide substrate in the presence of arsenic gas according to the method described above, and then removing the barium fluoride vapor source. Single crystal epitaxial barium fluoride layers can then later be deposited on the barium fluoride/gallium arsenide reaction product layer by the methods described above. Moreover, by depositing the barium fluoride vapor at a temperature of from room temperature to 400° C., or preferably from room temperature to 300° C. with the other conditions (deposition rate, vacuum) being the same, a uniform, single crystal epitaxial barium fluoride insulator layer is formed which is free of gallium ions.

Figure 5:
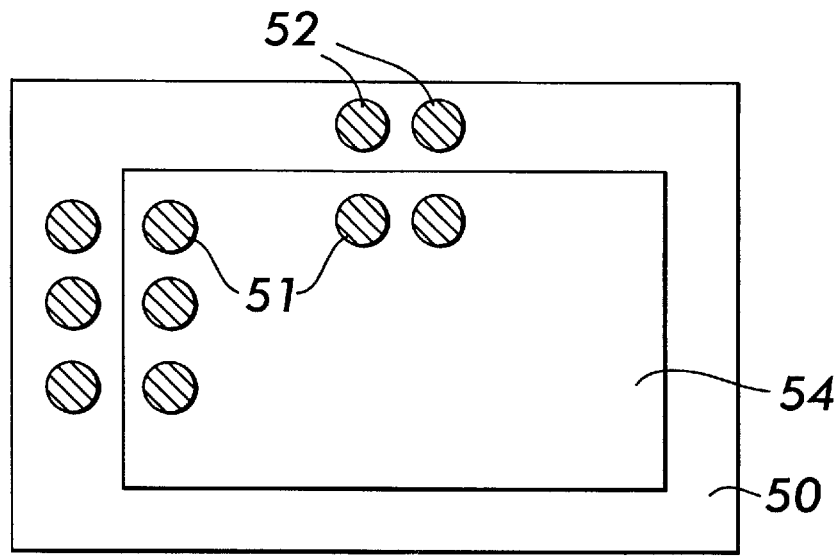
FIG. 5 is a schematic drawing of a top view of a suitable test set up for measuring the capacitance and the breakdown voltage of an insulator layer of this invention.

With reference to FIG. 5, a suitable test set up for measuring the capacitance and the breakdown voltage of an insulator layer of this invention is shown. An array of a plurality of gold dots 51, which are five in number for this illustration, is evaporated onto a (100) oriented single crystal epitaxial barium fluoride film 54 and a corresponding array of five (5) gold dots 52 is evaporated on to the adjoining edge of the (100) oriented single crystal gallium arsenide substrate 50 not exposed to the barium fluoride flux. Adjacent gold dots 51 and 52 form pairs that are used in the measurements. Interconnection wires, e.g., indium-soldered gold wires, are attached to the gold dots 51 on the barium film 54 and to the gold dots 52 on the gallium arsenide ubstrate 50. Capacitance and breakdown voltage measurements hen can be done on all five pairs of adjacent gold dots electrodes).

EXAMPLES

Example 1

An insulator layer was grown on single crystal gallium arsenide film by Molecular Beam Epitaxy in a VG Semicon V8OH deposition chamber according to the following protocol. The MBE system had Knudsen effusion cells, and a 30 kV RHEED system to monitor the film structure during film depositions. Heating of the GaAs substrate during film deposition operations described below was performed by tantalum foil strips located 1 cm above the back of the GaAs wafer. The temperature was measured by a thermocouple located above these heater strips and out of physical contact with the heater, substrate holder, and wafer substrate.

A single crystal gallium arsenide substrate was used which was a commercial (100) oriented 2 inch (5.1 cm) diameter wafer with a carrier concentration of approximately $3 \times 10^5$ carriers/cm$^3$ and arsenic to gallium concentration ratio of approximately 50/50. The GaAs (100) wafer was chemically etched before being introduced to the growth chamber using standard industry procedures.

With the GaAs substrate supported on a rotatable holder inside the MBE chamber trapped with LN$_2$, a GaAs (100) epilayer was then deposited on the GaAs wafer surface by opening of the shutters of a gallium effusion cell and a separate arsenic effusion cell under conventional conditions for such GaAs epilayer film formation until a streaky reflective high energy electron diffraction (RHEED) pattern was observed. Then, the gallium shutter was closed while leaving the arsenic shutter remaining open.

Next, while maintaining the substrate at 650° C., a BaF$_2$ shutter was opened to begin BaF$_2$ deposition while the arsenic shutter remained open. For this deposition stage, the BaF$_2$ and the arsenic were supplied by separate effusion cells located approximately 15 inches (38 cm) below the rotatable substrate holder and in which the respective cells had been heated effective to provide an arsenic flux of $1.0 \times 10^{-6}$ millibar and a BaF$_2$ flux of $1.0 \times 10^{-7}$ millibar in the MBE chamber.

15 seconds after the BaF$_2$ shutter was opened, then the arsenic shutter was closed while the BaF$_2$ shutter was left open, and BaF$_2$ deposition was permitted to proceed for 30 minutes while maintaining the substrate at 650° C. before the BaF$_2$ shutter was closed. During the BaF$_2$ deposition, the RHEED pattern remained streaky throughout, with RHEED oscillations clearly visible. After completing deposition of the BaF$_2$, the resulting GaAs wafer bearing the deposited films was cooled to room temperature in ~1 hour.

Based on RHEED patterns monitored during the above GaAs and BaF$_2$ film growth sequence, the wet chemical etch and GaAs epilayer growth resulted in a two-dimensional surface (i.e., a flat surface: no out-of-plane imperfections at the surface level), and the epitaxial BaF$_2$ layer deposited on the two-dimensional GaAs surface with arsenic overpressure during the initial BaF$_2$ deposition was also two-dimensional. By contrast, insulator layers formed with a similar growth sequence except without including the arsenic gas treatment had spotty RHEED patterns indicative of surface level roughness for the insulator layer. Specifically, it was observed in additional experimental comparison studies that deviating from the above BaF$_2$ film deposition protocol by interrupting the arsenic overpressure between the GaAs and BaF$_2$ film deposition stages or as little as 5 seconds caused the RHEED patterns of the aAs layer and the subsequent BaF$_2$ layer to degrade to an extent comparable to a rough epitaxial surface, which indicated the significance of the arsenic gas treatment.

The experimental results of the present invention are in sharp contrast to previous attempts by others discussed above in the Background section to grow (100) oriented and/or two-dimensional thin films of BaF$_2$ on GaAs.

The present inventors also have found by heavy ion backscattering spectroscopy that gallium and arsenic will diffuse into the BaF$_2$ lattice, but the Ba layer created at the GaAs/BaF$_2$ interface acts as an effective barrier against Ga and arsenic diffusion. The insulator layers of this invention have breakdown voltage fields in excess of $1 \times 10^7$ V/cm.

In summary, the BaF$_2$ layers grown during the present investigation (at 650° C.) were (100)-oriented throughout, and the RHEED patterns were consistently streaky with no rings or spots. The surface morphology of these (100)-oriented BaF$_2$ layers were two-dimensional (i.e., flat-surfaced). This occurs despite the surface free energy considerations which seemingly favors (111)-oriented films, or at the very least a (100)-orientation with exposed (111) facets. This suggests that surface free energy considerations are not applicable when an atomic template layer is employed for heteroepitaxy. Epitaxial BaF$_2$ (100) on a lattice mismatched substrate was made possible by chemically modifying the substrate surface before BaF$_2$ deposition. The two-dimensional morphology of this layer was made possible by maintaining the arsenic gas gas overpressure during the initial stages of the BaF$_2$ deposition.

While the invention has been shown and described with reference to certain preferred embodiments, it will be understood by those skilled in the art that changes in form and detail may be made without departing from the spirit and scope of the appended claims.

What is claimed is:

1. A coated substrate comprising:
   (a) a single crystal gallium arsenide substrate having a substrate surface, and
   (b) an insulator covering at least a portion of the gallium arsenide substrate surface, where said insulator includes a homogenous film comprising a monolayer of Group IIa metal atoms attached directly onto said gallium arsenide substrate surface, and a single crystal epitaxial film comprised of a Group IIa metal fluoride on said monolayer, where the substrate and single crystal epitaxial film have the same crystal orientation, and wherein the homogenous film is formed as the reaction product of a reaction between a Group IIa metal fluoride vapor and the gallium arsenide substrate surface in the presence of arsenic gas at said gallium arsenide substrate surface whereby two-dimensional growth of the single crystal epitaxial film results on said monolayer.

2. The coated substrate of claim 1, wherein the homogenous film is substantially free of Group IIa metal atoms unreacted with the gallium arsenide substrate surface when the reaction between the Group IIa metal fluoride vapor and the gallium arsenide substrate surface in the presence of arsenic gas is discontinued and before a deposition of the epitaxial film of Group IIa metal fluoride onto said monolayer has commenced.

3. The coated substrate of claim 1, wherein said Group IIa metal atoms are barium atoms and said Group IIa metal fluoride is barium fluoride.

4. The coated substrate of claim 1, wherein said Group IIa metal atoms are calcium atoms and said Group IIa metal fluoride is calcium fluoride.

5. The coated substrate of claim 1, wherein said Group IIa metal atoms are strontium atoms and said Group IIa metal fluoride is strontium fluoride.

6. The coated substrate of claim 3, wherein the single crystal gallium arsenide substrate surface and the single crystal epitaxial barium fluoride film both are (100) oriented.

7. The coated substrate of claim 3, wherein the single crystal gallium arsenide substrate surface and the single crystal epitaxial barium fluoride film both are (111) oriented.

8. The coated substrate of claim 1, wherein the single crystal gallium arsenide substrate is selected from the group consisting of gallium arsenide single crystal wafers, gallium arsenide epitaxial layers on gallium arsenide single crystal wafers, and heterostructures of super-lattice made of combinations of gallium arsenide alloys on gallium arsenide single crystal wafers.

9. The coated substrate of claim 1, wherein said epitaxial film of barium fluoride has a thickness ranging from 50 Å to 10,000 Å.

10. The coated substrate of claim 1, wherein said homogenous Group II metal film has a thickness of less than 5 Å.

11. A gallium arsenide metal insulator semiconductor field effect transistor comprising a single crystal gallium arsenide semiconductor substrate having a substrate surface, a source, a drain, a channel connecting the source to the drain, and an insulator layer which is deposited onto the channel and which separates the channel from a metal gate electrode which controls the current in channel, wherein the insulator layer includes a homogenous film comprising a monolayer of barium atoms attached directly onto said gallium arsenide substrate surface, and a single crystal epitaxial film of barium fluoride on said monolayer, where the substrate and single crystal epitaxial film have the same crystal orientation, and wherein the homogenous film is formed as the reaction product of a reaction between barium fluoride vapor and the gallium arsenide substrate surface in the presence of arsenic gas at said gallium arsenide substrate surface such that the homogenous film is substantially free of barium atoms unreacted with the gallium arsenide substrate surface when the reaction is completed and a two-dimensional growth of the epitaxial film of barium fluoride onto said monolayer has commenced.

12. The gallium arsenide metal insulator semiconductor field effect transistor of claim 11, wherein said field effect transistor is an n-channel field effect transistor.

13. The gallium-arsenide metal insulator semiconductor field effect transistor of claim 11, wherein said field effect transistor is a p-channel field effect transistor.

14. A gallium arsenide charge coupled device comprising a doped single crystal gallium arsenide semiconductor substrate having a substrate surface, and an array of metal gate electrodes separated from the substrate surface by an insulator layer, wherein the insulator layer includes a homogenous film comprising a monolayer of barium atoms attached directly onto said gallium arsenide substrate surface, and a single crystal epitaxial film of barium fluoride on said monolayer, where the substrate and single crystal epitaxial film have the same crystal orientation, and wherein the homogenous film is formed as the reaction product of a reaction between barium fluoride vapor and the gallium arsenide substrate surface in the presence of arsenic gas at said gallium arsenide substrate surface such that the homogenous film is substantially free of barium atoms unreacted with the gallium arsenide substrate surface when the reaction is completed and a two-dimensional growth of the epitaxial film of barium fluoride onto said monolayer has commenced.

15. A gallium arsenide capacitor device comprising a doped single crystal gallium arsenide semiconductor substrate having a substrate surface, and a first metal electrode in contact with the gallium arsenide substrate surface and a second metal electrode separated from the substrate surface by an insulator layer, wherein the insulator layer includes a homogenous film comprising a monolayer of barium atoms attached directly onto said gallium arsenide substrate surface, and a single crystal epitaxial film of barium fluoride on said monolayer, where the substrate and single crystal epitaxial film have the same crystal orientation, and wherein the homogenous film is formed as the reaction product of a reaction between barium fluoride vapor and the gallium arsenide substrate surface in the presence of arsenic gas at said gallium arsenide substrate surface such that the homogenous film is substantially free of barium atoms unreacted with the gallium arsenide substrate surface when the reaction is completed and a two-dimensional growth of the epitaxial film of barium fluoride onto said monolayer has commenced.

16. A nonvolatile memory device comprising:

a single crystal gallium arsenide semiconductor substrate having a substrate surface, a source, a drain, a channel connecting the source to the drain, a first insulator layer deposited onto the channel, wherein the first insulator layer includes a homogenous film comprising a monolayer of barium atoms attached directly onto said gallium arsenide substrate surface, and a single crystal epitaxial film of barium fluoride on said monolayer, where the substrate and single crystal epitaxial film have the same crystal orientation, and an electrically conductive floating gate electrode separated from the channel by the first insulator layer, a second insulator layer overlying the floating gate electrode, an electrically conductive gate electrode overlying the second insulator layer, and wherein the homogenous film of the first insulator layer is formed as the reaction product of a reaction between barium fluoride vapor and the gallium arsenide substrate surface in the presence of arsenic gas at said gallium arsenide substrate surface such that the homogenous film is substantially free of barium atoms unreacted with the gallium arsenide substrate surface when the reaction is completed and a two-dimensional growth of the epitaxial film of barium fluoride onto said monolayer has commenced.

\* \* \* \* \*